US008397359B2

(12) United States Patent
Andrews et al.

(10) Patent No.: US 8,397,359 B2
(45) Date of Patent: Mar. 19, 2013

(54) METHOD OF MANUFACTURING A DROP GENERATOR

(75) Inventors: John R. Andrews, Fairport, NY (US); Terrance L. Stephens, Molalla, OR (US)

(73) Assignee: Xerox Corporation, Norwalk, CT (US)

(*) Notice: Subject to any disclaimer, the term of this patent is extended or adjusted under 35 U.S.C. 154(b) by 0 days.

(21) Appl. No.: 13/195,256

(22) Filed: Aug. 1, 2011

(65) Prior Publication Data

US 2011/0284657 A1 Nov. 24, 2011

Related U.S. Application Data

(62) Division of application No. 11/635,409, filed on Dec. 7, 2006, now Pat. No. 8,006,356.

(51) Int. Cl.
*H01L 41/22* (2006.01)
*B29C 65/50* (2006.01)

(52) U.S. Cl. ....... 29/25.35; 29/890.1; 29/846; 427/96.1; 427/98.4; 347/68; 347/70; 156/230

(58) Field of Classification Search ................. 29/890.1, 29/25.35, 846, 831; 347/68, 70; 428/461; 156/230; 239/102.2; 427/96.1, 98.4, 100
See application file for complete search history.

(56) References Cited

U.S. PATENT DOCUMENTS

| | | | | |
|---|---|---|---|---|
| 4,268,575 | A * | 5/1981 | Shinozaki et al. | 428/461 X |
| 4,680,595 | A | 7/1987 | Cruz-Uribe et al. | |
| 5,342,654 | A | 8/1994 | Koizumi et al. | |
| 5,622,748 | A | 4/1997 | Takeuchi et al. | |
| 5,764,596 | A | 6/1998 | Hanafy et al. | |
| 6,341,851 | B1 | 1/2002 | Takayama et al. | |
| 6,361,152 | B1 * | 3/2002 | Fujisawa | 347/68 |
| 6,457,222 | B1 | 10/2002 | Torii et al. | |
| 6,550,691 | B2 * | 4/2003 | Pence | 239/102.2 |
| 6,557,986 | B2 | 5/2003 | Watanabe et al. | |
| 6,666,943 | B2 | 12/2003 | Wada et al. | |

FOREIGN PATENT DOCUMENTS

| | | | |
|---|---|---|---|
| JP | 03097566 | A * | 4/1991 |
| JP | 05169654 | A * | 7/1993 |

* cited by examiner

*Primary Examiner* — A. Dexter Tugbang
(74) *Attorney, Agent, or Firm* — Fay Sharpe LLP

(57) ABSTRACT

A method for making a plurality of electromechanical transducers includes, depositing a layer of conductive material attached to a first side of a piezoelectric layer to form a laminar structure, attaching the laminar structure to a rigid carrier substrate using a removable double-sided tape, forming piezoelectric transducers, attaching the electromechanical transducer to a fluid channel substructure, and removing the rigid carrier substrate and the double-sided tape.

11 Claims, 5 Drawing Sheets

METHOD OF MANUFACTURING A DROP GENERATOR

INCORPORATION BY REFERENCE

This is a divisional of application of U.S. Ser. No 11/635,409, filed Dec. 7, 2006, (U.S. Publication No 2008-0138925-A1) entitled "DROP GENERATOR", by John R. Andrews et al., the disclosure of which is hereby incorporated by reference in its entirety.

BACKGROUND

The subject disclosure is generally directed to drop emitting apparatus including, for example, drop jetting devices.

Drop on demand ink jet technology for producing printed media has been employed in commercial products such as printers, plotters, and facsimile machines. Generally, an ink jet image is formed by selective placement on a receiver surface of ink drops emitted by a plurality of drop generators implemented in a printhead or a printhead assembly. For example, the printhead assembly and the receiver surface are caused to move relative to each other, and drop generators are controlled to emit drops at appropriate times, for example by an appropriate controller. The receiver surface can be a transfer surface or a print medium such as paper. In the case of a transfer surface, the image printed thereon is subsequently transferred to an output print medium such as paper.

DETAILED DESCRIPTION

Figure 1:
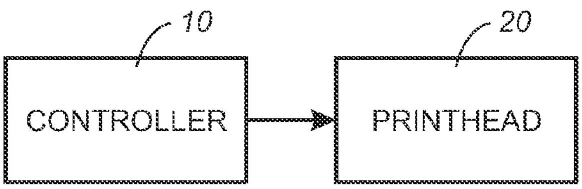
FIG. 1 is a schematic block diagram of an embodiment of a drop-on-demand drop emitting apparatus.

FIG. 1 is a schematic block diagram of an embodiment of a drop-on-demand printing apparatus that includes a controller 10 and a printhead assembly 20 that can include a plurality of drop emitting drop generators. The controller 10 selectively energizes the drop generators by providing a respective drive signal to each drop generator. Each of the drop generators can employ a piezoelectric transducer.

Figure 2:
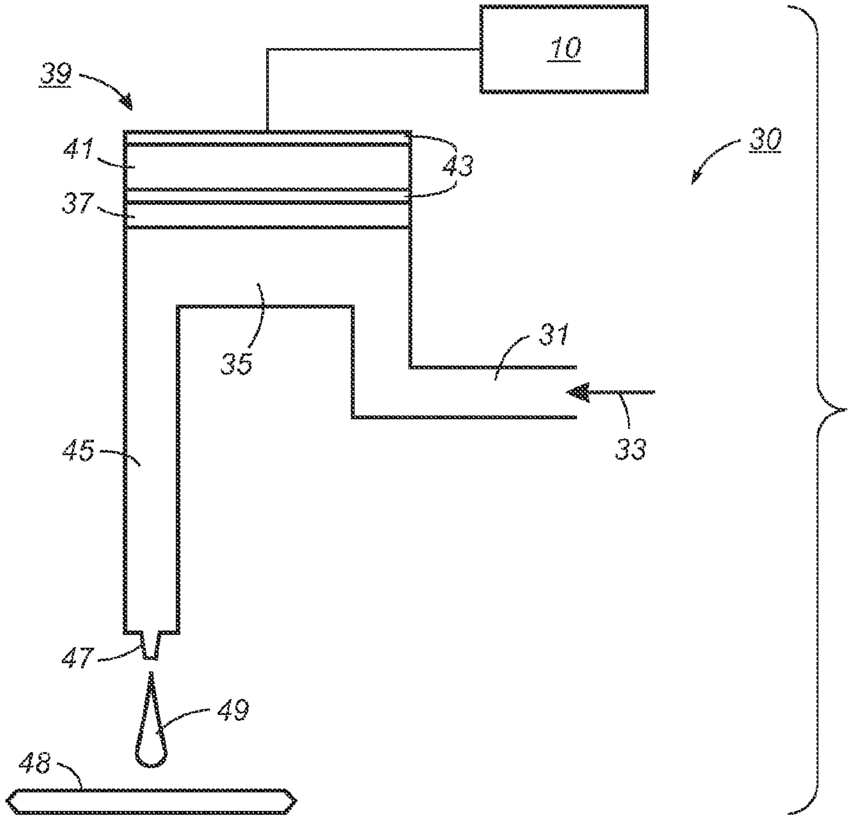
FIG. 2 is a schematic block diagram of an embodiment of a drop generator that can be employed in the drop emitting apparatus of FIG. 1.

FIG. 2 is a schematic block diagram of an embodiment of a drop generator 30 that can be employed in the printhead assembly 20 of the printing apparatus shown in FIG. 1. The drop generator 30 includes an inlet channel 31 that receives ink 33 from a manifold, reservoir or other ink containing structure. The ink 33 flows into an ink pressure or pump chamber 35 that is bounded on one side, for example, by a flexible diaphragm 37. A pair of electrodes 43 that receive drop firing and non-firing signals from the controller 10, and a piezo element 41 disposed therebetween are attached to the flexible diaphragm 37. The electrodes 43, the piezo element 41, and the flexible diaphragm 37 can be considered a piezoelectric or electromechanical transducer 39 that is actuated by the controller. If the diaphragm 37 is made of a conductive material, it can comprise an electrode of the piezoelectric transducer 39. Actuation of the electromechanical transducer 39 causes ink to flow from the pressure chamber 35 through an outlet channel 45 to a drop forming nozzle or orifice 47, from which an ink drop 49 is emitted toward a receiver medium 48 that can be a transfer surface, for example. For convenience, the piezo element 41 and the electrodes 43 can be considered a driver of the electromechanical transducer.

The ink 33 can be melted or phase changed solid ink, and the electromechanical transducer 39 can be a piezoelectric transducer that is operated in a bending mode, for example.

Figure 3:
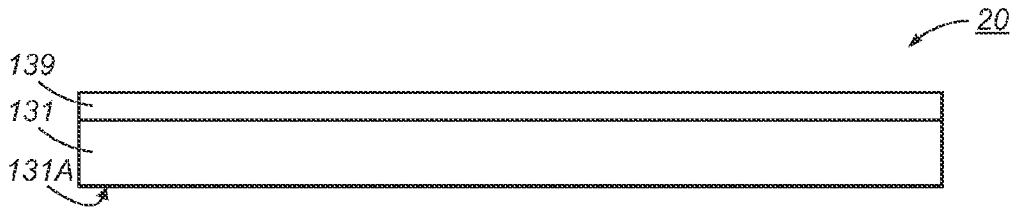
FIG. 3 is a schematic elevational view of an embodiment of an ink jet printhead assembly.

FIG. 3 is a schematic elevational view of an embodiment of an ink jet printhead assembly 20 that can implement a plurality of drop generators 30 (FIG. 2) as an array of drop generators. The ink jet printhead assembly includes a fluid channel layer or substructure 131 and a transducer layer or substructure 139 attached to the fluid channel substructure 131. The fluid channel substructure 131 implements fluid channels and portions of chambers of the drop generators 30, while the transducer substructure 139 implements the transducers 39 of the drop generators. The nozzles of the drop generators 30 are disposed on an outside surface 131A of the fluid channel layer 131 that is opposite the diaphragm layer 137, for example.

By way of illustrative example, the fluid channel substructure 131 can comprise a laminar stack of plates or sheets, such as stainless steel.

FIGS. 4A-4G are schematic cross-sectional views of structures being processed that illustrate a procedure for making an array of drop generators.

Figure 4A:
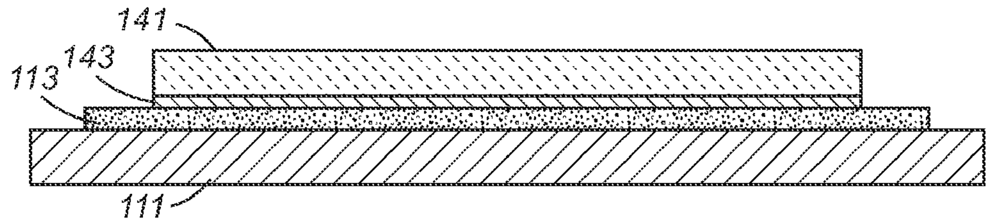
FIGS. 4A-4G are schematic cross-sectional views of structures that illustrate an embodiment of a procedure for making an array of drop generators.
Figure 4B:
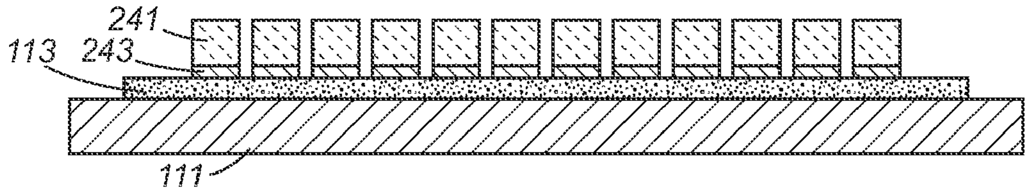

Referring to FIGS. 4A and 4B, an array of portions of electromechanical transducers is formed. For example, a laminar piezoelectric assembly comprising a piezoelectric slab 141 and a relatively thin metal electrode layer 143 is attached to a rigid carrier 111 using double sided tape 113, wherein the relatively thin metal electrode layer 143 is on the side of the piezoelectric slab 141 attached to the tape. A further relatively thin metal electrode layer can optionally be on the other side of the piezoelectric slab 141. The relative thin metal electrode layer or layers can comprise nickel (Ni), for example, and can be formed by a variety of suitable techniques such as vacuum deposition (e.g., sputtering or chemical vapor deposition) or electroless metal plating. The piezoelectric assembly is diced or kerfed through the piezoelectric slab 141 and the electrode layer 143, for example using a dicing saw as is conventional in the semiconductor industry, to form an array of individual electrode/piezo elements, each element comprising a metal electrode 243 and a piezoelectric element 241.

The individual piezo elements can alternatively be formed by screen printing, sol gel deposition, or other deposition techniques.

Figure 4C:
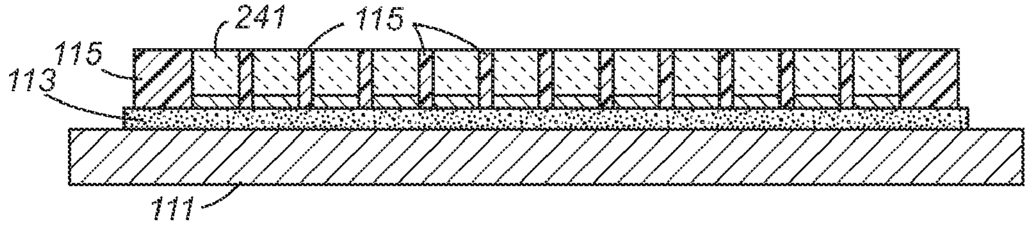

The array of electrode/piezo elements of the structure of FIG. 4B is then planarized to produce the structure of FIG. 4C. For example, the kerf regions between the electrode/piezo elements of the array are filled with a polymer 115 such as epoxy or polyvinyl alcohol. Following the polymer fill, the entire array of electrode/piezo elements can optionally be lapped to a desired thickness using conventional lapping or polishing equipment.

Figure 4D:
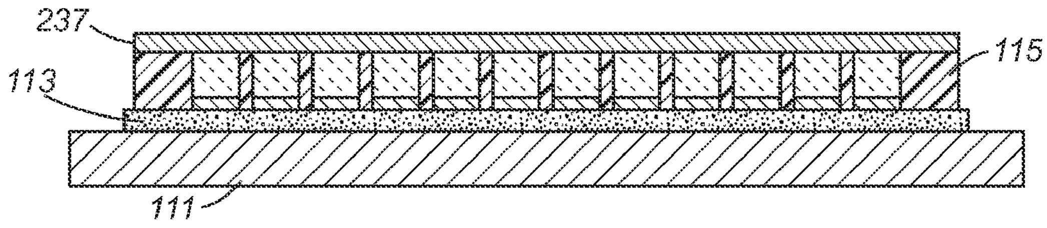

The planarized structure of FIG. 4C is subjected to metal deposition to produce a relatively thick metal layer 237 covering the array of individual electrode/piezo elements as schematically illustrated in FIG. 4D. The structure of FIG. 4D generally comprises a plurality of piezoelectric transducers disposed on a carrier substrate, wherein each piezoelectric transducer includes a relatively thick deposited metal diaphragm 237. By way of illustrative examples, the deposited metal diaphragm 237 can comprise nickel or chromium, and can be produced by electroless deposition, electroplating, or other deposition techniques such as vacuum deposition (e.g., sputtering or chemical vapor deposition). The deposited metal diaphragm layer 237 can have a thickness that is at least about 5 microns, for example in the range of about 5 microns to about 15 microns. As another example, the thickness of the deposited metal layer 237 can be at least about 0.5 to 3 microns. As yet another example, the thickness of the deposited metal layer 237 can be no greater than 30 microns, for example in the range of about 15 microns to about 30 microns.

Figure 4E:
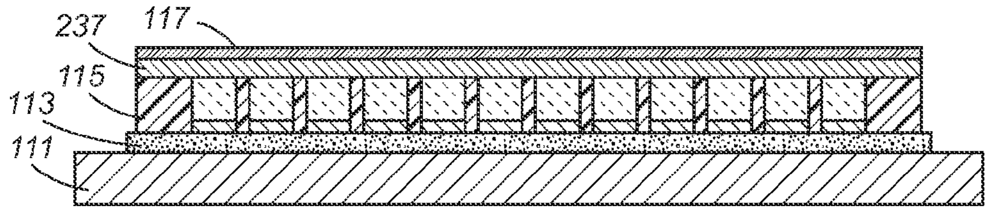

An attachment layer 117 is formed on the relatively thick metal diaphragm layer 237 as schematically shown in FIG. 4E. The attachment layer 117 can comprise a relatively low temperature solder layer formed by electroplating, for example. As another embodiment, the attachment layer 117 can comprise a thermoplastic adhesive layer comprising polyimide, epoxy or acrylic adhesive, for example. As a further embodiment, the attachment layer 117 can comprise a thermoplastic layer such as thermoplastic polyimide. The attachment layer 117 can also comprise a low temperature glass frit.

Figure 4F:
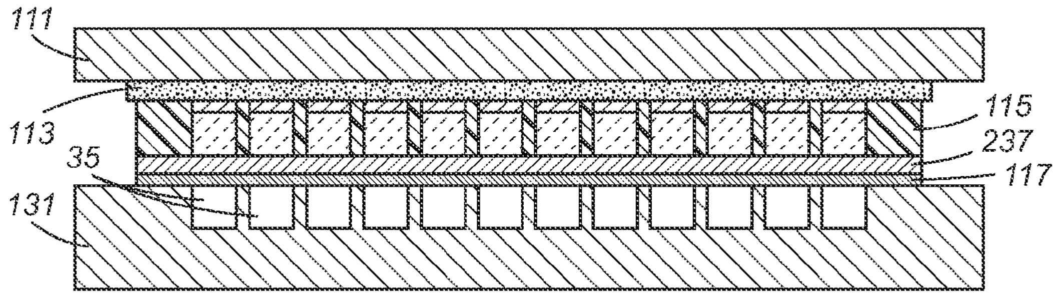

As schematically illustrated in FIG. 4F by way of illustrative example, the structure of FIG. 4E can be attached to a fluid channel layer 131 having pressure chambers 35 by reflowing the relatively low temperature solder layer, or by curing the adhesive layer, as appropriate for the particular implementation.

The carrier 111 and tape 113 are removed to produce the structure of

Figure 4G:
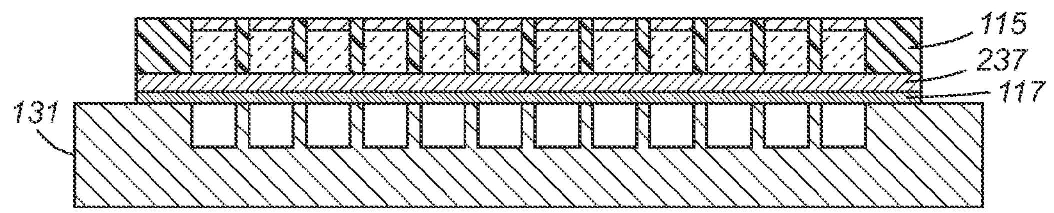

FIG. 4G. The planarizing polymer can be left in place, or it can be removed with an appropriate developer, for example.

FIGS. 5A-5E are schematic cross-sectional views of structures being processed that illustrate a further procedure for making a plurality of drop generators.

Figure 5A:
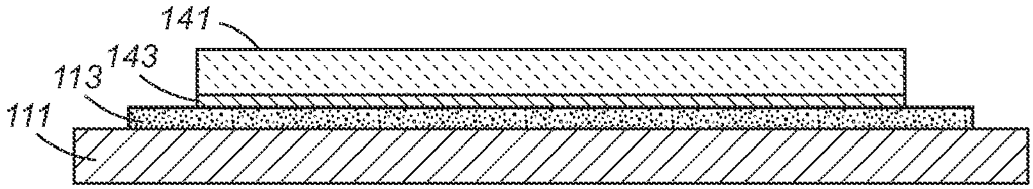
FIGS. 5A-5E are schematic cross-sectional views of structures that illustrate another embodiment of a procedure for making an array of drop generators.

Referring to FIG. 5A, a laminar piezoelectric assembly comprising a piezoelectric slab 141 and a relatively thin metal electrode layer 143 is attached to a rigid carrier using double sided tape 113, wherein the relatively thin metal electrode layer 143 is on the side of the piezoelectric slab 141 attached to the tape. By way of illustrative example, the thin metal electrode layer can comprise deposited nickel.

Figure 5B:
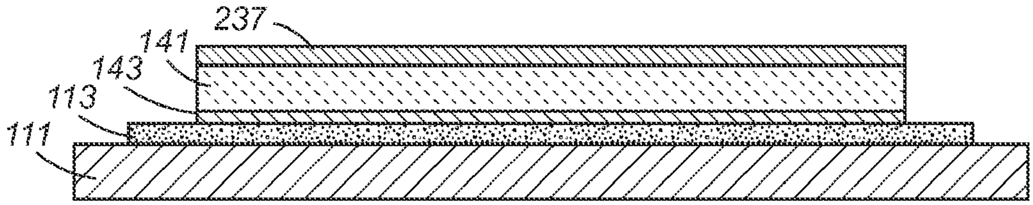

The structure of FIG. 5A is subjected to metal deposition to produce a relatively thick metal layer 237 covering the piezoelectric slab 141, as shown in FIG. 5B. By way of illustrative examples, the deposited metal layer 237 can comprise nickel or chromium, and can be formed by electroless deposition, electroplating, or other metal deposition methods such as vacuum deposition (e.g., sputtering or chemical vapor deposition). By way of illustrative example, the metal layer 237 can have a thickness that is at least about 5 microns, for example in the range of about 5 microns to about 15 microns. As another example, the thickness of the deposited metal layer 237 can be at least about 0.5 to 3 microns. As yet another example, the thickness of the deposited metal layer 237 can be no greater than about 30 microns, for example in the range of about 15 microns to about 30 microns.

Figure 5C:
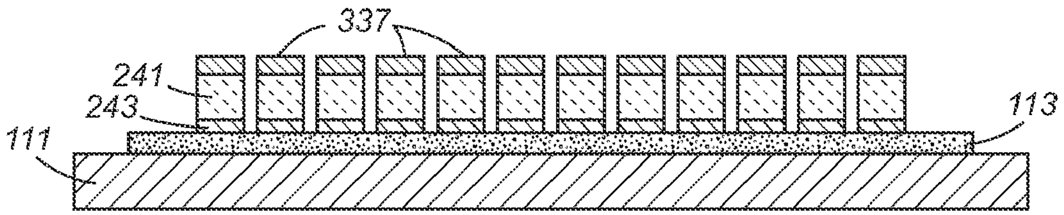

The structure of FIG. 5B is diced or kerfed through the metal layer 237, the piezoelectric slab 141, and the electrode layer 143 using, for example, a dicing saw to produce an array of individual piezoelectric transducers as shown in FIG. 5C, each transducer comprising a thin metal portion 243, a piezoelectric element 241 and a relatively thick deposited metal portion 337.

Figure 5D:
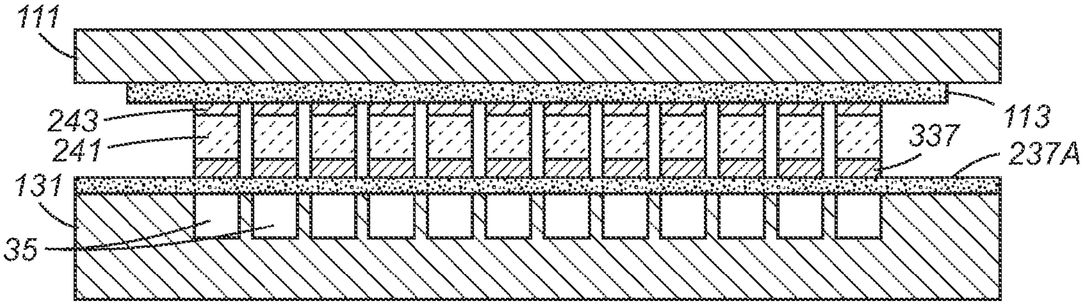

As schematically depicted in FIG. 5D, the structure of FIG. 5C is attached using a suitable adhesive to a metallized polymer diaphragm sub-layer 237A that is attached to a fluid channel sub-structure 131 having pressure chambers 35 by glue, for example. The metallized polymer diaphragm sub-layer 237A can comprise polyimide, for example.

Figure 5E:
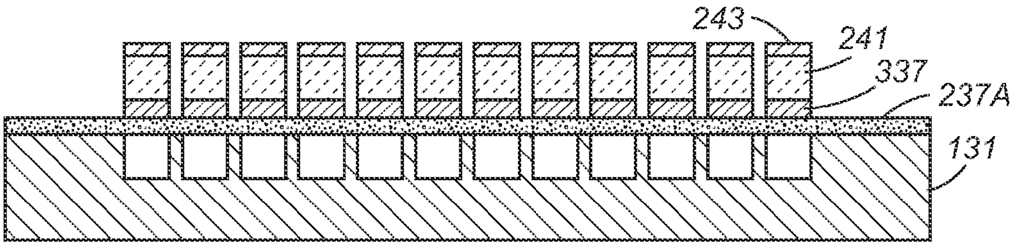

The carrier 111 and tape 113 are removed to produce the structure of FIG. 5E wherein the relatively thick deposited metal portions 337 and the metallized polymer diaphragm sub-layer 237A form the electrodes and diaphragms of the piezoelectric transducers.

The foregoing can advantageously provide for efficient manufacture of arrays of piezoelectric drop generators, as well as other electromechanical devices.

The claims, as originally presented and as they may be amended, encompass variations, alternatives, modifications, improvements, equivalents, and substantial equivalents of the embodiments and teachings disclosed herein, including those that are presently unforeseen or unappreciated, and that for example, may arise from applicants/patentees and others. Unless specifically recited in a claim, steps or components of claims should not be implied or imported from the specification or any other claims as to any particular order, number, position, size, shape, angle, color, or material.

What is claimed is:

1. A method of making a plurality of electromechanical transducers, the method comprising:

depositing a layer of conductive material attached to a first side of a piezoelectric layer to form a laminar structure;

attaching the laminar structure to a rigid carrier substrate using a removable double-sided tape;

after the attaching the laminar structure to the rigid carrier, forming piezoelectric transducers; and, attaching the piezoelectric transducers to a fluid channel substructure; and after the attaching to the fluid channel substructure, removing the rigid carrier substrate and the double-sided tape from the laminar structure.

2. A method according to claim 1, wherein the layer of conductive material is on the side attached to the double-sided tape.

3. A method according to claim 1 further comprising:

planarizing an array of the piezoelectric transducers.

4. A method according to claim 1 further comprising forming an attachment layer on the plurality of piezoelectric transducers.

5. A method according to claim 1 further comprising forming a solder layer on the plurality of piezoelectric transducers.

6. A method according to claim 1 wherein the attaching the piezoelectric transducers to the fluid channel substructure includes attaching the piezoelectric transducers to the fluid channel substructure having a conductive polymer diaphragm sub-layer.

7. A method according to claim 1 wherein the attaching the piezoelectric transducers to the fluid channel substructure includes attaching the piezoelectric transducers to a fluid channel substructure having a conductive polyimide diaphragm sub-layer.

8. A method according to claim 1 wherein the depositing of the metal layer is formed by electroless double plating.

9. A method according to claim 1, wherein the depositing of the metal layer is formed by vacuum deposition.

10. A method according to claim 1 further comprising:

after the depositing, dicing the laminar structure to produce a plurality of individual piezoelectric transducers.

11. A method according to claim 1 further comprising:

depositing a metal layer on a second side of the piezoelectric layer.

* * * * *